(12) United States Patent
Souetinov

(10) Patent No.: US 6,211,718 B1
(45) Date of Patent: Apr. 3, 2001

(54) LOW VOLTAGE DOUBLE BALANCED MIXER

(75) Inventor: Viatcheslav I Souetinov, Swindon (GB)

(73) Assignee: Motel Semiconductor Limited (GB)

( * ) Notice: Subject to any disclaimer, the term of this patent is extended or adjusted under 35 U.S.C. 154(b) by 0 days.

(21) Appl. No.: 09/003,908

(22) Filed: Jan. 7, 1998

(30) Foreign Application Priority Data

Jan. 11, 1997 (GB) .................................................. 9700486

(51) Int. Cl.[7] .................................................. G06G 7/016
(52) U.S. Cl. ........................... 327/359; 327/356; 455/333
(58) Field of Search ..................................... 327/356, 357, 327/359; 455/333

(56) References Cited

U.S. PATENT DOCUMENTS

| 4,667,342 | 5/1987 | Lindenmeier et al. | 455/150 |
|---|---|---|---|
| 5,521,545 | * 5/1996 | Terry et al. | 327/356 |
| 5,825,231 | * 10/1998 | Chevallier et al. | 327/356 |

FOREIGN PATENT DOCUMENTS

| 0 584 870 A1 | 3/1994 | (EP) . |
|---|---|---|
| 0 726 646 A1 | 8/1996 | (EP) . |
| 2 262 403 | 6/1993 | (GB) . |
| 2 299 230 | 9/1996 | (GB) . |
| 96/23365 | 8/1996 | (WO) . |

* cited by examiner

Primary Examiner—Kenneth B. Wells
(74) Attorney, Agent, or Firm—Kirschstein, et al.

(57) ABSTRACT

Mixer circuit 300 receives a single-ended rf voltage signal on terminal 330 and a bias potential on terminal 361. Transistor 301 functions as a transconductance amplifier and presents a current signal, representative of the input voltage signal, to mixer core 391. Inductor 310 provides noiseless degeneration in the base-emitter circuit of transistor 301. Local oscillator driver 393 is configured such that its common mode output impedance is higher than the input impedance of transistors 305 and 306. In this way, phase splitting is carried out within the mixer core 391 itself and less transistors are needed. Mixer circuit 300 thereby requires less voltage headroom than prior art mixers.

10 Claims, 3 Drawing Sheets

LOW VOLTAGE DOUBLE BALANCED MIXER

BACKGROUND OF THE INVENTION

The present invention relates to mixer circuits and in particular to mixer circuits having a single-ended input and a differential output.

RF mixers are the key blocks of modern radio systems and their parameters determine the main characteristics of the system in which they are used. The most common mixer circuit configurations are those of the Gilbert cell and the Micromixer, shown in FIGS. 1 and 2 respectively.

Each of these mixer circuits receives at its input terminal a single-ended rf input signal and provides at its output a differential signal being the input signal first amplified and subsequently mixed with a signal from a local oscillator. Both of these circuits are easily implemented in IC form and are commonly used in mobile telephones and the like. However, mixers constructed using these circuit configurations exhibit poor noise properties. They also require a supply voltage of 2.7 V or more because each has three transistors in series between supply and ground. This can make them unsuitable for low voltage applications.

Referring to FIG. 1, Gilbert cell circuit 100 receives a single-ended input voltage signal at terminal 130 and a differential local oscillator voltage signal at terminals 140 and 141. Transistors 101, 102, resistors 110, 111 and current source 115 form a differential transconductance amplifier 160 whilst transistors 103–106 form a mixer core 150. An increasing input voltage at terminal 130 will cause an increasing signal current to flow from the collector terminal of transistor 101. Current source 115 and resistors 110, 111 ensure that a complementary decreasing current will flow from the collector electrode of transistor 102. These current signals will be balanced if current source 115 is implemented as a constant current source.

Mixer core 150 receives differential local oscillator signals on terminals 140, 141. When the voltage on terminal 140 is positive, the voltage on terminal 141 will be negative causing transistors 104 and 105 to be switched on and transistors 103 and 106 to be switched off. The collector current of transistor 101 will therefore be routed to output electrode 121 whilst the collector current of transistor 102 will be routed to output terminal 120. The collector currents of transistors 101, 102 will be switched to the opposite output terminal 120, 121 when terminal 141 receives a higher voltage than terminal 140.

The poor noise properties of this mixer configuration are due largely to the thermal noise of resistors 110 and 111 which produce noise directly in the main current paths. Current source 115 will also introduce noise into the output signal, because it experiences quite large voltage swings across its input and output terminals. A significant amount of noise will appear at output terminals 120, 121 as a result of transistors 101 and 102 having their base resistances in series.

The micromixer circuit 200 of FIG. 2 receives a single-ended input signal at input terminal 230 and differential local oscillator signals at terminals 240 and 241. Transistors 201–203 and resistors 210–212 form a transconductance amplifier 260 whilst transistors 204–207 form a mixer core 250.

An increase in voltage at input terminal 230 will cause increased current to flow from the collector electrode of transistor 202 and a decreased current to flow from the collector of transistor 203. The circuit therefore acts as a transconductance amplifier having a single-ended input and a differential output. The output from amplifier 260 is provided on the collector electrodes of transistors 202 and 203, as a differential current signal, to mixer core 250.

Mixer core 250 functions in the same manner as mixer core 150 of the FIG. 1 mixer circuit described above.

Micromixer circuits have very linear characteristics and large dynamic range at radio frequencies but, due to the large number of resistors used in the main current paths, have even worse noise properties than Gilbert cell circuits. There exists a need for a mixer circuit with improved noise properties and low voltage supply requirements.

SUMMARY OF THE INVENTION

In accordance with the present invention, there is provided a mixer circuit arrangement comprising a mixer core and a single-ended amplifier stage, in which the mixer core is arranged to receive a single-ended output signal of the amplifier stage on a first main input and to provide a differential output signal in response thereto.

In accordance with another aspect of the present invention there is provided a mixer circuit arrangement for providing differential output signals in response to an input signal applied thereto, comprising a mixer core having first and second current signal inputs and first and second local oscillator inputs, a single-ended amplifier stage for applying a current signal to said first signal input of said mixer core in response to said input signal, and bias means having a low ac impedance for applying a bias current to said second signal input of said mixer core.

BRIEF DESCRIPTION OF THE DRAWINGS

An embodiment of the present invention will now be described, by way of example only, with reference to the accompanying drawings, of which.

DETAILED DESCRIPTION OF THE PREFERRED EMBODIMENT

Figure 1:
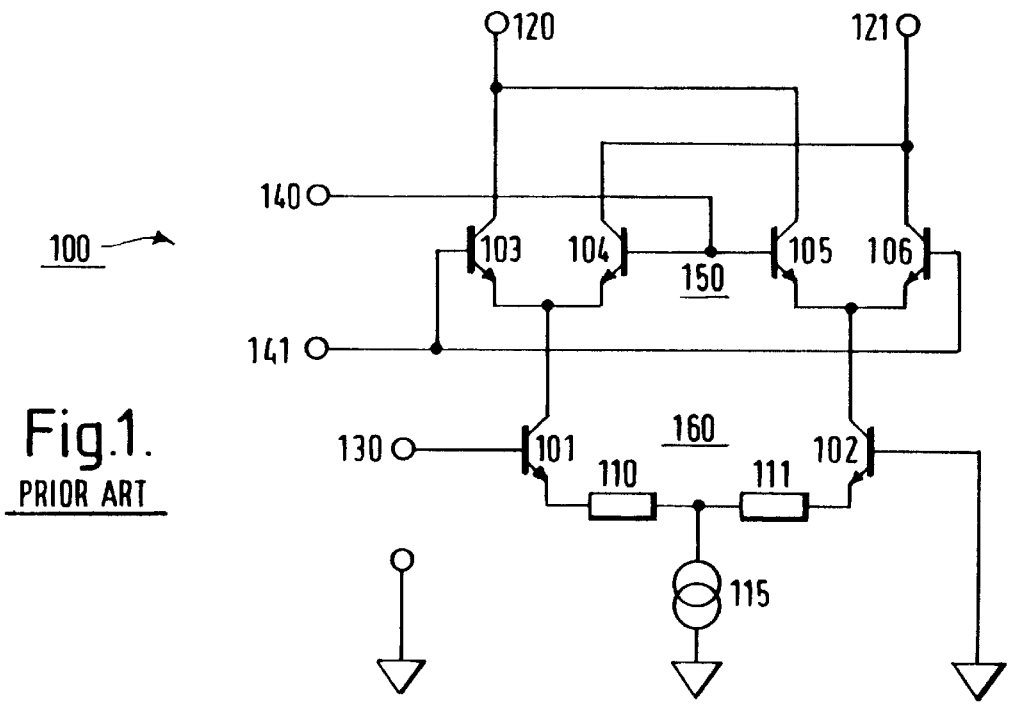
FIG. 1 shows a prior art Gilbert cell mixer circuit.
Figure 2:
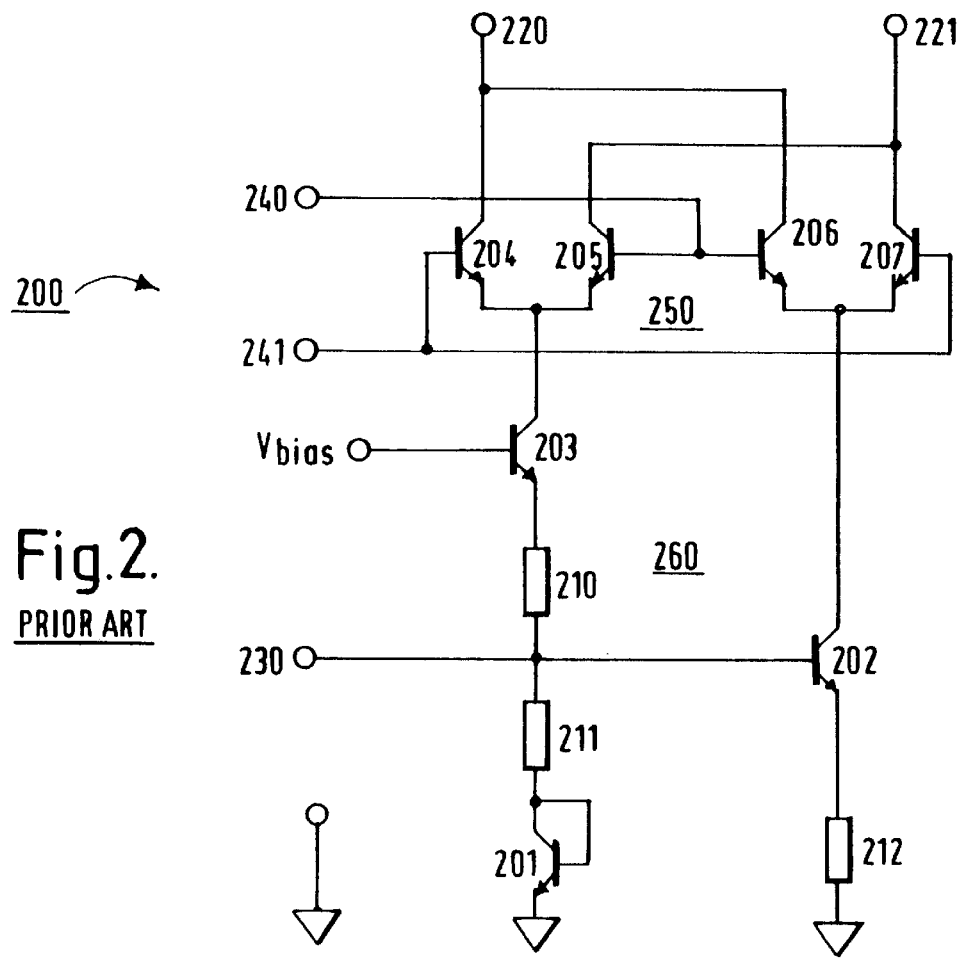
FIG. 2 shows a prior art Micromixer circuit.
Figure 3:
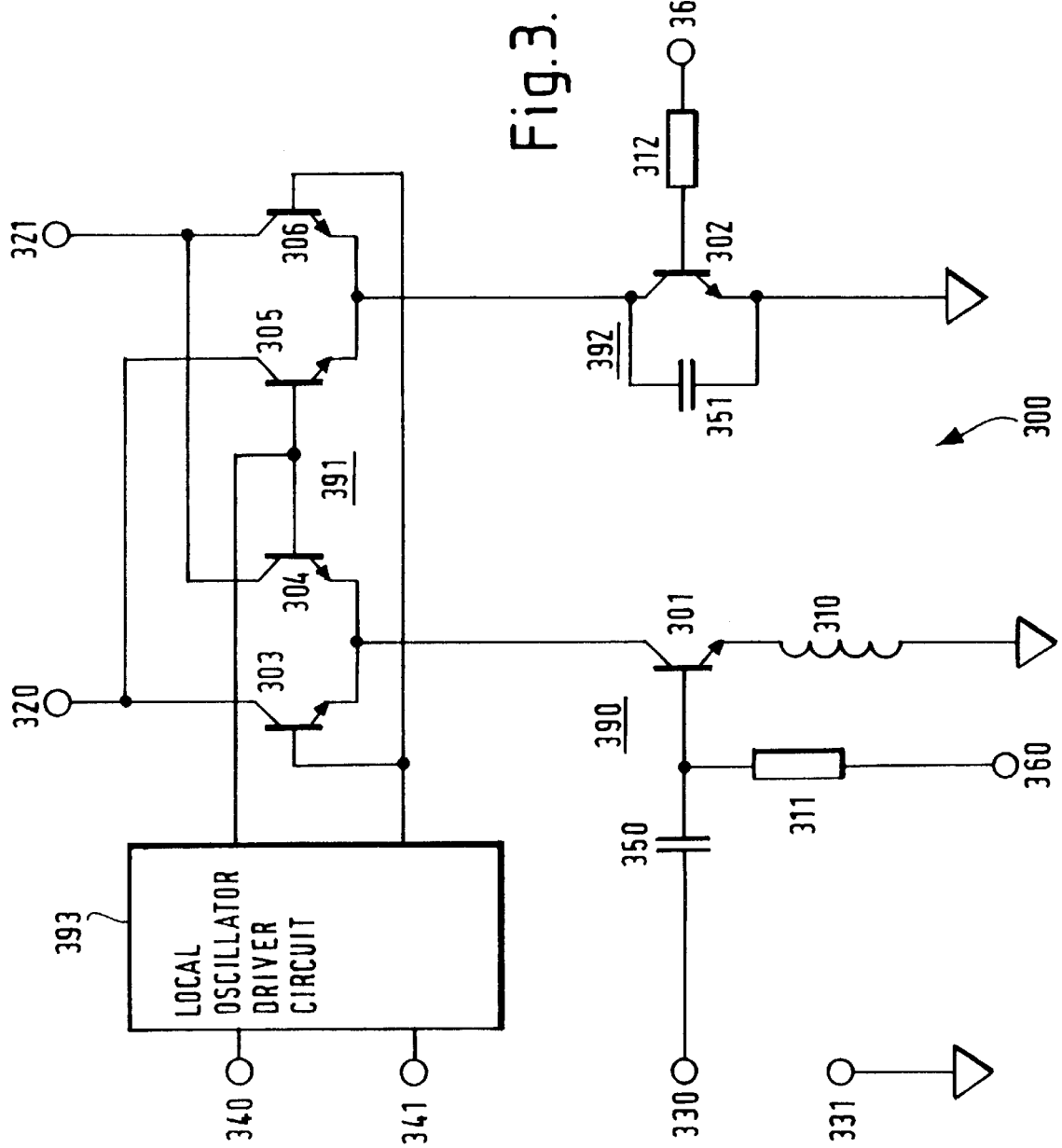
FIG. 3 shows a mixer circuit in accordance with the present invention.

Referring to the drawings, FIG. 3 shows a double-balanced mixer circuit arrangement in accordance with the present invention.

Mixer circuit 300 is made up of amplifier 390, bias arrangement 392, mixer core 391 and local oscillator driver 393. In operation, differential local oscillator signals are applied to terminals 340 and 341, bias potentials are applied to terminals 360 and 361, a single-ended input signal is applied to terminal 330 and a differential output signal is obtained at terminals 320, 321.

Amplifier 390 is centred around transistor 301. The base electrode of transistor 301 is connected to terminal 360 by resistor 311 and to terminal 330 by capacitor 350. Inductor 310 is connected between the emitter electrode of transistor 301 and ground potential. The collector electrode of transistor 301 forms the output current path to mixer core 391.

Current bias arrangement 392 comprises transistor 302 which has its emitter electrode connected directly to ground potential, its base electrode connected to terminal 361 by resistor 312 and provides a current signal to mixer core 391 from its collector electrode. Capacitor 351 is connected between the collector electrode of transistor 302 and ground potential.

Mixer core 391 comprises four transistors 303–306. Transistors 303 and 304 have their emitter electrodes coupled together and receive the output current signal of amplifier 390. Transistors 305 and 306 have their emitter electrodes coupled together and receive the current provided by bias arrangement 392. The collector electrodes of transistors 303 and 305 are connected together and to output terminal 320 whilst the collector electrodes of transistors 304 and 306 are connected together and to the other output terminal 321. Mixer core 391 is arranged to be controlled by local oscillator driver 393 by the connection of the base electrodes of transistors 303–306 to the differential outputs of local oscillator driver 393. Transistors 303 and 306 have their base electrodes connected together and to a first output of local oscillator driver 393 whilst transistors 304 and 305 have their base electrodes connected together and to the other output of local oscillator driver 393.

Amplifier 390 receives an RF voltage signal at terminal 330 and translates it to a current signal which is provided at the collector electrode of transistor 301. Amplifier 390 thus forms a high impedance current source. Capacitor 350 acts to block any dc component of the input signal. DC biasing of transistor 301 is achieved by way of resistor 311 and the bias potential applied to terminal 360. Due to the complex value of the common emitter current gain β of the transistor 301 at radio frequencies, the inductor 310 effects series negative feedback in the base-emitter circuit of transistor 301.

Inductor 310 is a noiseless component which provides frequency independent degeneration over a particular frequency range. This range is dependent on the value of inductor 310 and the base-emitter resistance of transistor 301 at the desired frequency. The value of inductor 310 also affects the gain of amplifier 390 and its linearity. Although a resistor could be used in place of inductor 310, amplifier 390 has much more linear characteristics and better noise properties when inductor 310 is used.

Inductor 310 can be implemented, in whole or in part, with the parasitic inductance of IC packaging, bonding wires and/or connecting pins.

Transistor 301 is preferably fabricated with a large emitter area to minimise the noise produced by its base-emitter resistance. However, a larger area transistor will also have higher parasitic capacitances, and hence leakage, and a lower current gain β because of a lower current density. A trade-off therefore needs to be made between noise figure and gain when choosing what transistor area and what bias current should be incorporated into a particular mixer circuit design.

The input impedance of mixer circuit 300 is determined by the value of inductor 310 and by unity current gain-frequency $f_T$ of transistor 301.

Bias arrangement 392 operates to provide a biasing current to transistors 305, 306 of mixer core 391 from the collector electrode of transistor 302. Resistor 312 connects the base electrode of transistor 302 to terminal 361, to which a biasing potential is applied. Capacitor 351 provides low impedance grounding of the ac component of the signal present on the collector electrode of transistor 302. The dc component of this current signal will remain reasonably constant.

The requirements of local oscillator driver 393 are that it needs to provide translation of the voltage signal applied to its input terminals to its output terminals and to present a high common mode output impedance with respect to the ground potential to which the input signal is referred. The reasons for this will become apparent on reading the description of the operation of mixer core 391 below.

Figure 4:
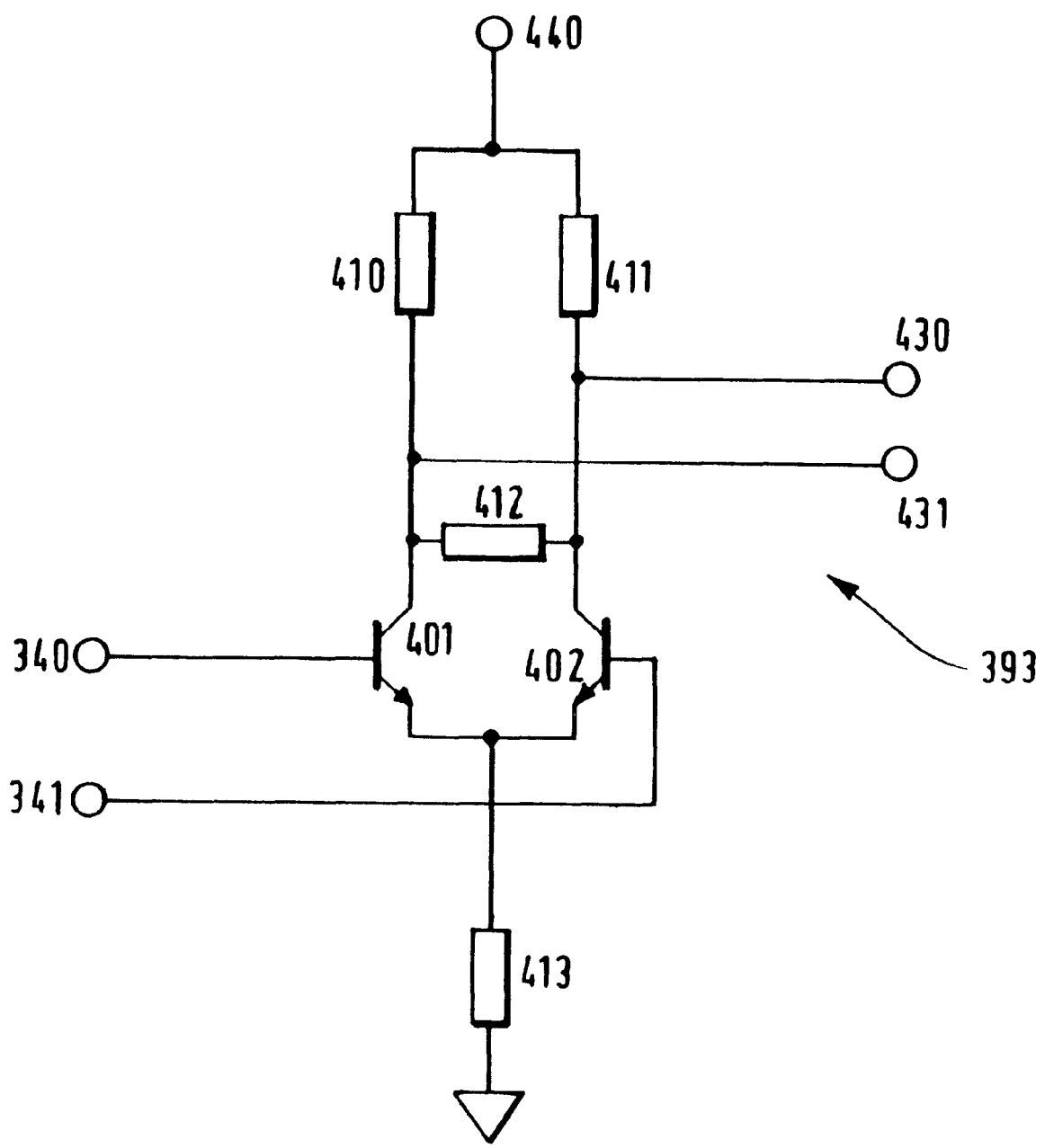
FIG. 4 shows a local oscillator driver circuit suitable for use in the mixer circuit of FIG. 3.

Local oscillator driver 393 could be implemented as a transformer. In the case where local oscillator driver 393 has to be integrated on the same chip as the rest of mixer circuit 300, it can be implemented as the local oscillator driver circuit 493 in FIG. 4.

The driver circuit 493 comprises a long-tailed pair of transistors 401, 402 having their base electrodes connected to respective local oscillator signal input terminals 340, 341. Resistors 410 and 411 connect the collector electrodes of transistors 401 and 402 respectively to a supply voltage terminal 440. Resistor 412 is connected between the emitter electrodes of transistors 401 and 402. Local oscillator driver circuit output terminals 430, 431 are connected to the collector electrodes of transistors 402, 401 respectively. These terminals 430, 431 form the connections to the base electrodes of the transistors 303–306 of mixer core 391 of FIG. 3.

Local oscillator driver circuit 493 is controlled by a local oscillator signal applied to local oscillator input terminals 340, 341. Transistors 401 and 402 are "hard-switched" by the local oscillator signal such that they conduct alternately and thus provide a positive voltage alternately on terminals 430 and 431. This voltage switches on transistors 304 and 305 and transistors 303 and 306 alternately.

In the case where transistors 304 and 305 are switched on, the collector current of transistor 301 passes through the emitter and into the base and collector electrodes of transistor 304. The collector current of transistor 304, which is passed to output terminal 321, will be proportional to the base current, scaled up by a factor of the current gain of that transistor, β. Provided that the input impedance of transistor 305 is low compared with that of the common mode output impedance of local oscillator driver circuit 493, signal currents from the base electrode of transistor 304 will flow primarily to the base electrode of transistor 305 and that transistor will have a collector current that complements the collector current of transistor 304. If the common mode output impedance, with reference to the input signal to ground, is sufficiently greater than the input impedance of transistor 305, a balanced output will be provided at differential output terminals 320, 321.

Balancing of the mixer core output can be further controlled by virtue of the independent biasing of transistors 303, 306 and 304, 305, the control provided by varying the potentials applied to terminals 360, 361.

In the case where transistors 303 and 306 are switched on, the collector current of transistor 301 will be passed to the opposite differential output terminal 320 and its complement passed to the other terminal 321.

Thus the conversion of the single-ended input signal into a differential output signal is carried out within the mixer core 391 itself, allowing fewer transistors to be used in the mixer circuit implementation and thereby allowing a lower supply voltage to be used.

The complementary current of transistors 305 and 306 can be increased by forming transistors 303 and 304 with larger emitter areas than transistors 305 and 306 (for example in the ratio of 3:2 or 2:1 depending on the frequencies involved). This will cause a higher base current in transistors 303 and 304 to compensate for losses due to the parasitic capacitances of the mixer core transistors.

The common mode output impedance of local oscillator driver circuit 493 is determined by resistors 410 and 411. The values of these resistors should be as high as is possible consistent with proper operation of driver circuit 493. Resistors 410 and 411 would usually be much larger than resistor 412, which resistor determines the differential output impedance of local oscillator driver circuit 493. Resistors 410 and 411 could equally be substituted with suitable inductors to achieve substantially the same effect.

Although the embodiments have been described solely with regard to npn bipolar transistors, the invention is not restricted to such and could equally be effected with pnp bipolar transistors or with field effect transistors. The collector and emitter electrodes referred to would correspond to the drain and source electrodes as the first and second main electrodes of a field effect transistor.

What is claimed is:

1. A mixer circuit arrangement, comprising:
   a) an amplifier stage having a single-ended input and a single-ended output;
   b) a mixer core having first and second current signal inputs, first and second local oscillator inputs, and first and second differential outputs, the first current signal input of the mixer core being connected to the output of the amplifier stage;
   c) a bias circuit having an output and a ground connection, the bias circuit comprising a source of DC current between the output of the bias circuit and the ground connection, the output of the bias circuit being connected to the second current signal input of the mixer core;
   d) a capacitor having first and second electrodes connected to respective ones of the output and the ground connection of the bias circuit; and
   e) a local oscillator driver circuit having a first oscillator input, and first and second outputs having a common mode output impedance and being connected respectively to the first and second local oscillator inputs of the mixer core, the first and second local oscillator inputs of the mixer core having a lower input impedance as compared to the common mode output impedance of the first and second outputs of the local oscillator driver circuit.

2. The mixer circuit arrangement in accordance with claim 1, in which the mixer core is a double balanced mixer core.

3. The mixer circuit arrangement in accordance with claim 1, in which the amplifier stage comprises an amplifying transistor connected to operate as a transconductance amplifier.

4. The mixer circuit arrangement in accordance with claim 3, in which the amplifying transistor has a control electrode which is connected to the amplifier stage input, a first main electrode which is connected to the amplifier stage output, and a second main electrode which is connected to the ground connection.

5. The mixer circuit in accordance with claim 4, in which the control electrode of the amplifying transistor is DC biased and is connected to the amplifier stage input via an input capacitor.

6. The mixer circuit arrangement in accordance with claim 4, in which an inductor is connected between the second main electrode of the amplifying transistor and the ground connection.

7. The mixer circuit arrangement in accordance with claim 1, in which the bias circuit comprises a biasing transistor having a control electrode which is DC biased, a first main electrode which is connected to the bias circuit output, and a second main electrode which is connected to the ground connection.

8. The mixer circuit arrangement as claimed in claim 1, in which the local oscillator driver circuit includes a second oscillator input, and first and second transistors, the first and second transistors each having a control electrode, and first and second main electrodes, the control electrode of the first transistor being connected to the first oscillator input, and the control electrode of the second transistor being connected to the second oscillator input, the second main electrodes of the first and second transistors being connected together and to a current source, and the first main electrodes of the first and second transistors being connected respectively to the first and second outputs of the local oscillator driver circuit.

9. The mixer circuit arrangement as claimed in claim 8, in which a first resistor is connected between the first main electrode of the first transistor and a supply voltage, and a second resistor is connected between the first main electrode of the second transistor and the supply voltage.

10. The mixer circuit arrangement as claimed in claim 9, in which the local oscillator driver circuit further comprises a third resistor connected between the first main electrodes of the first and second transistors.

* * * * *

UNITED STATES PATENT AND TRADEMARK OFFICE
CERTIFICATE OF CORRECTION

PATENT NO.    : 6,211,718 B1                                                    Page 1 of 1
DATED         : April 3, 2001
INVENTOR(S)   : Viatcheslav Igor Souetinov It is certified that error appears in the above-identified patent and that said Letters Patent is hereby corrected as shown below:

<u>Title page,</u>
Item [73], please change "Motel" to -- Mitel --.

Signed and Sealed this

Twenty-third Day of July, 2002

Attest:

JAMES E. ROGAN
Attesting Officer          Director of the United States Patent and Trademark Office